United States Patent
Rai et al.

(10) Patent No.: US 8,848,375 B2
(45) Date of Patent: Sep. 30, 2014

(54) SYSTEM AND METHOD FOR REDUCED THERMAL RESISTANCE BETWEEN A POWER ELECTRONICS PRINTED CIRCUIT BOARD AND A BASE PLATE

(75) Inventors: Rutunj Rai, Canton, MI (US); Richard Hampo, Plymouth, MI (US); John Mills, Bloomfield Hills, MI (US)

(73) Assignee: Lear Corporation, Southfield, MI (US)

( * ) Notice: Subject to any disclaimer, the term of this patent is extended or adjusted under 35 U.S.C. 154(b) by 430 days.

(21) Appl. No.: 12/886,228

(22) Filed: Sep. 20, 2010

(65) Prior Publication Data

US 2011/0068737 A1   Mar. 24, 2011

Related U.S. Application Data

(60) Provisional application No. 61/245,464, filed on Sep. 24, 2009.

(51) Int. Cl.
- *H05K 7/20* (2006.01)
- *H05K 7/14* (2006.01)
- *F28F 7/00* (2006.01)
- *H01L 23/34* (2006.01)

(52) U.S. Cl.
CPC ...................................... *H05K 7/142* (2013.01)
USPC ........... 361/716; 361/713; 361/719; 361/720; 165/80.2; 257/713; 174/526

(58) Field of Classification Search
USPC ................. 361/713, 715, 704–711, 719–721, 361/679.54; 165/80.2, 185; 257/712–713; 174/526, 547, 252; 320/107
See application file for complete search history.

(56) References Cited

U.S. PATENT DOCUMENTS

| | | | | |
|---|---|---|---|---|
| 3,749,601 A | * | 7/1973 | Tittle | 428/76 |
| 5,198,963 A | * | 3/1993 | Gupta et al. | 361/715 |
| 5,355,280 A | | 10/1994 | Rothlingshofer et al. | |
| 5,679,457 A | * | 10/1997 | Bergerson | 428/344 |
| 5,819,402 A | * | 10/1998 | Edwards et al. | 29/840 |
| 5,969,945 A | * | 10/1999 | Cutting et al. | 361/704 |
| 5,973,923 A | | 10/1999 | Jitaru | |
| 5,990,776 A | | 11/1999 | Jitaru | |
| 6,057,593 A | * | 5/2000 | Iovdalsky et al. | 257/659 |

(Continued)

FOREIGN PATENT DOCUMENTS

EP          1739741 A2    3/2007

OTHER PUBLICATIONS

"Gap Filler 1500 (Two-Part), Thermally Conductive Liquid Gap Filling Material," The Berquist Company, 2008.

*Primary Examiner* — Zachary M Pape
(74) *Attorney, Agent, or Firm* — Brooks Kushman P.C.

(57) ABSTRACT

An apparatus includes a base plate including a plurality of depressions, and a power electronics printed circuit board including a plurality traces and a plurality of high voltage components. The plurality of high voltage components is located at a plurality of locations corresponding to the plurality of depressions in the base plate. A plurality of fasteners secures the printed circuit board to the base plate with the plurality of high voltage components received at the corresponding plurality of depressions. A thermally conductive and electrically isolating interface between the base plate and the printed circuit board is made of a gap filler material conforming to the base plate and to the plurality of depressions in the base plate, and conforming to the printed circuit board and to the plurality of high voltage components.

20 Claims, 2 Drawing Sheets

(56) References Cited

U.S. PATENT DOCUMENTS

| | | |
|---|---|---|
| 6,549,409 B1 * | 4/2003 | Saxelby et al. ............... 361/704 |
| 6,555,756 B2 | 4/2003 | Nakamura et al. |
| 6,998,533 B2 * | 2/2006 | De Samber et al. .......... 174/521 |
| 7,206,205 B2 | 4/2007 | Obu et al. |
| 7,365,273 B2 * | 4/2008 | Fairchild et al. .............. 174/260 |
| 7,375,974 B2 * | 5/2008 | Kirigaya ....................... 361/752 |
| 8,130,496 B2 * | 3/2012 | Dong et al. ................... 361/700 |
| 2002/0134532 A1 * | 9/2002 | Hirano et al. ................. 165/80.3 |
| 2003/0161105 A1 | 8/2003 | Kataria |
| 2003/0161110 A1 * | 8/2003 | Spasevski et al. ............ 361/715 |
| 2007/0004090 A1 | 1/2007 | Brandenburg et al. |
| 2008/0093114 A1 * | 4/2008 | Lee ............................... 174/260 |
| 2011/0026226 A1 * | 2/2011 | Zheng et al. .................. 361/709 |

\* cited by examiner

SYSTEM AND METHOD FOR REDUCED THERMAL RESISTANCE BETWEEN A POWER ELECTRONICS PRINTED CIRCUIT BOARD AND A BASE PLATE

CROSS-REFERENCE TO RELATED APPLICATION

This application claims the benefit of U.S. provisional Application No. 61/245,464 filed Sep. 24, 2009. The disclosure of which is incorporated in its entirety by reference herein.

TECHNICAL FIELD

The invention relates to reducing thermal resistance between a power electronics printed circuit board and a base plate.

BACKGROUND

High voltage electrical modules generate a lot of heat on printed circuit board (PCB) traces and high voltage components. This heat has to dissipate to a cold or base plate. Dissipating the heat requires a low thermal resistance between the PCB/high voltage component and the cold plate. Thermal resistance is inversely proportional to contact surface area.

In one existing approach to dissipating the generated heat, thermal pads are placed between the printed circuit board (PCB)/high voltage components and the cold plate. The thermal pads provide a path for heat to be removed while providing electrical isolation. Thermal pads require a certain compression to be effective. The compression to the thermal pad is created by the fasteners mounting the printed circuit board (PCB), and causes stress and deflection in the printed circuit board (PCB). Due to such deflection, the printed circuit board (PCB) can lose contact with the thermal pads, and thus have higher than expected thermal resistance to the cold plate.

A prior art mounting arrangement for mounting the printed circuit board (PCB)/high voltage component is shown in FIG. 1. A base or cold plate is shown at 10. A printed circuit board (PCB) 12 includes traces and high voltage components. Heat generated on the traces and high voltage components needs to be transferred to the base plate 10. The printed circuit board (PCB) includes wound components including ferrite cores 14, 16. Thin thermal pads 20 are placed between the printed circuit board (PCB) 12 and the base plate 10. A thick thermal pad 22 is placed between the ferrite core 16 and the base plate 10. Base plate 10 is shaped to receive PCB 12, and includes a recessed portion/depression 26 for receiving ferrite core 16. Thick thermal pad 22 is located at the bottom surface 28 of the depression 26 of base plate 10.

Thermal pads 20 and 22 are intended to close air gaps, while providing electrical isolation, when PCB 12 is secured by fasteners 24 to base plate 10. The compression to the thermal pads 20, 22 created by fasteners 24 mounting the printed circuit board (PCB) 12 causes stress and deflection in the printed circuit board (PCB) 12. Due to such deflection, the printed circuit board (PCB) 12 can lose contact with the thermal pads 20, and thus have higher than expected thermal resistance to the cold plate 10. This is shown at air gaps 30 between thin thermal pads 20 and PCB 12, which have very poor thermal transfer.

In another existing approach, additional fasteners may be used to try and reduce stress and deflection in the printed circuit board (PCB). However, additional bolts increase the size, weight, and cost of the assembly.

For the foregoing reasons, there is a need for an improved system and method for reducing thermal resistance between a power electronics printed circuit board and a base plate.

Background information may be found in U.S. Pat. Nos. 5,355,280; 5,679,457; 6,555,756; 7,206,205; and 7,365,273. Further background information may be found in U.S. Pub. Nos. 2003/0161105 and 2007/0004090, and in EP 1 739 741. Further background information may be found in "Gap Filler 1500 (Two-Part), Thermally Conductive Liquid Gap Filling Material," The Berquist Company, 2008.

SUMMARY

It is an object of the invention to reduce thermal resistance between a power electronics printed circuit board and a base plate, in an apparatus such as an onboard battery charger for a vehicle.

In one embodiment, an apparatus comprises a base plate including a plurality of depressions, and a power electronics printed circuit board. The printed circuit board includes a plurality traces and a plurality of high voltage components. The plurality of high voltage components is located at a plurality of locations corresponding to the plurality of depressions in the base plate. The apparatus further comprises a plurality of fasteners securing the printed circuit board to the base plate with the plurality of high voltage components received at the corresponding plurality of depressions. A thermally conductive and electrically isolating interface between the base plate and the printed circuit board is made of a gap filler material conforming to the base plate and to the plurality of depressions in the base plate. The gap filler material also conforms to the printed circuit board and to the plurality of high voltage components.

At the more detailed level, any embodiments of the invention may further include any one or more of various additional possible features. For example, in one such feature, the interface is formed by applying the gap filler material as a substantially liquid material that cures into a solid. The substantially liquid material is displaced when the printed circuit board is secured to the base plate to cause the gap filler material to conform to the base plate, the plurality of depressions, the printed circuit board, and the plurality of high voltage components. The gap filler material may be applied in two parts which are mixed and that cure into the solid.

In some embodiments, the interface includes a substantially uniform layer of the gap filler material between the printed circuit board and the base plate. The layer may cover the plurality of high voltage components.

In another embodiment, an onboard battery charger for an automotive vehicle is provided. The battery charger comprises a housing including a base plate. The base plate includes a plurality of depressions. A power electronics printed circuit board includes a plurality traces and a plurality of high voltage components. The plurality of high voltage components is located at a plurality of locations corresponding to the plurality of depressions in the base plate. The printed circuit board includes a battery charger circuit.

The battery charger further comprises a plurality of fasteners securing the printed circuit board to the base plate with the plurality of high voltage components received at the corresponding plurality of depressions.

A thermally conductive and electrically isolating interface between the base plate and the printed circuit board is made of a gap filler material conforming to the base plate and to the plurality of depressions in the base plate. The gap filler material also conforms to the printed circuit board and to the plurality of high voltage components.

In another embodiment, a method of making a power electronics apparatus is provided. The method comprises providing a base plate including a plurality of depressions. The method further comprises providing a power electronics printed circuit board including a plurality traces and a plurality of high voltage components. The plurality of high voltage components are located at a plurality of locations corresponding to the plurality of depressions in the base plate.

The method further comprises forming a thermally conductive and electrically isolating interface between the base plate and the printed circuit board. The interface is made of a gap filler material conforming to the base plate and to the plurality of depressions in the base plate, and conforming to the printed circuit board and to the plurality of high voltage components. The method further comprises securing the printed circuit board to the base plate with the plurality of high voltage components received at the corresponding plurality of depressions.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

In one embodiment, the weakness of thermal pads may be overcome by using a substantially liquid material, which may be two-part. This liquid gap filler may be dispensed with robotic equipment in one or more patterns on the cold plate.

The PCB assembly may then be placed on the cold plate. The securing of the PCB with fasteners such as bolts displaces the liquid gap filler to form a substantially uniform layer of material between the PCB assembly and the cold plate, covering all or substantially all of the PCB and high voltage components.

In such a fashion, all or substantially all of the PCB surface area including high voltage components may be kept in contact with the cold plate without creating stress in the PCB. Such a configuration meets requirements for high voltage isolation with a gap of less than 2 mm. A smaller gap also provides a lower thermal resistance. Such a configuration is also less expensive to produce as a result of a production process that can be more readily automated. The gap filler also provides good adhesion between PCB and the base plate.

In one embodiment, the gap filler material is Gap Filler 1500 (Two-Part), available from The Berquist Company, Chanhassen, Minn.

It is appreciated that other gap filler materials may be used in other embodiments of the invention. A suitable material conforms to the base plate, depressions in the base plate, the printed circuit board, and high voltage components, while providing a thermally conductive and electrically isolating interface. One of ordinary skill in the art may choose a suitable gap filler material depending on the application.

Figure 1:
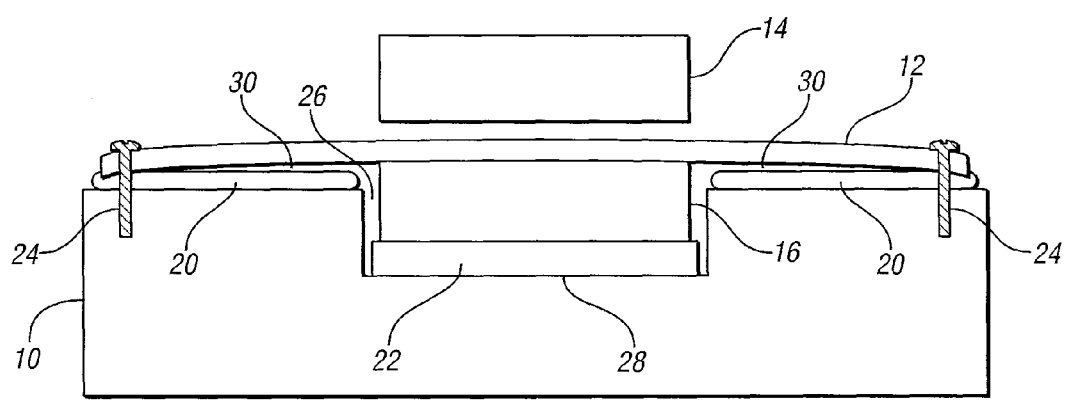
FIG. 1 illustrates a prior art mounting arrangement for mounting the printed circuit board (PCB)/high voltage component.
Figure 2:
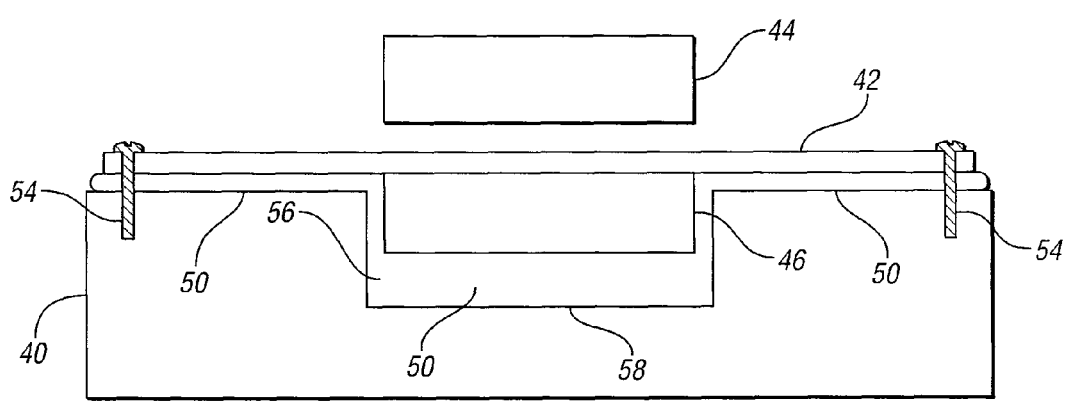
FIG. 2 illustrates a mounting arrangement for mounting the printed circuit board (PCB)/high voltage component, in an embodiment of the invention.

FIG. 2 illustrates a mounting arrangement for mounting the printed circuit board (PCB)/high voltage component, in an embodiment of the invention. As shown, a base or cold plate is shown at 40. A printed circuit board (PCB) 42 includes traces and high voltage components. Heat generated on the traces and high voltage components needs to dissipate to the base plate 40. The printed circuit board (PCB) 42 includes high voltage components 44, 46.

A thermally conductive and electrically isolating interface 50 between the base plate 40 and the printed circuit board (PCB) 42 is made of a gap filler material conforming to the base plate 40 and the PCB 42. In more detail, base plate 40 includes a plurality of depressions, including depression 56 having bottom 58. High voltage components (or other components) are located at locations corresponding to depressions 56 in the base plate 40.

The gap filler material conforms to the base plate 40, depressions 56, PCB 42, and high voltage components 46. A plurality of fasteners 54 secure PCB 42 to base plate 40 with the high voltage and other components received in depressions in the base plate.

Figure 3:
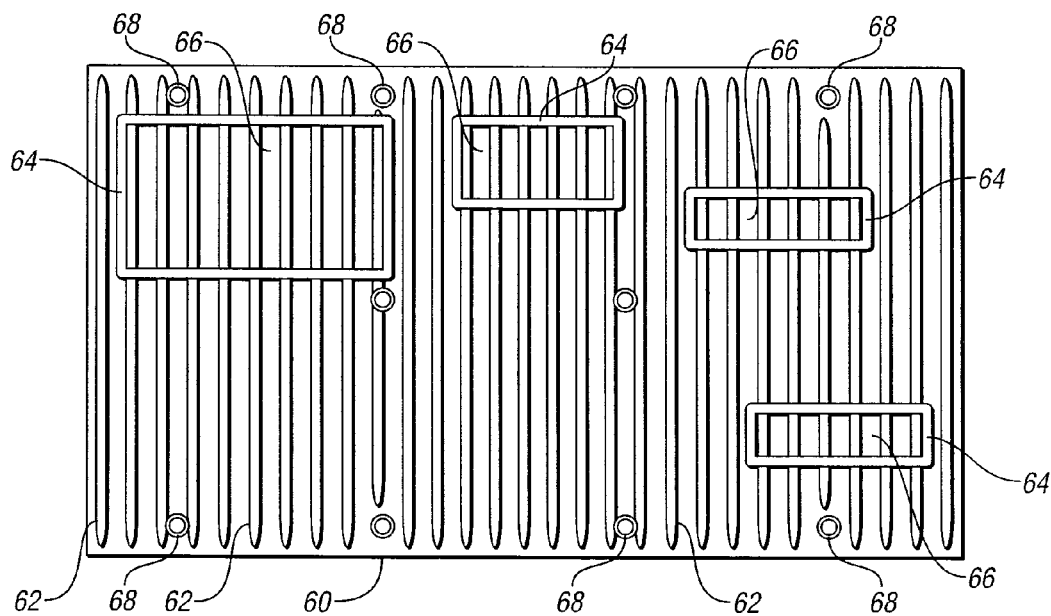
FIG. 3 illustrates a base plate including a plurality of depressions, with a gap filler material applied to the base plate.

Embodiments of the invention may further include any one or more of various additional possible features. FIG. 3 illustrates a base plate 60 including a plurality of depressions 66. Gap filler material is applied to the base plate 60 in patterns 62 (parallel lines of material) and in patterns 64 (following the periphery of each depression 66). Holes 68 are for receiving respective fasteners. The gap filler material in this embodiment is substantially liquid material that cures into a solid. The substantially liquid material 62, 64 is displaced when the printed circuit board is secured to the base plate 60 to cause the gap filler material 62, 64 to conform to the base plate 60 as shown in FIG. 4.

Figure 4:
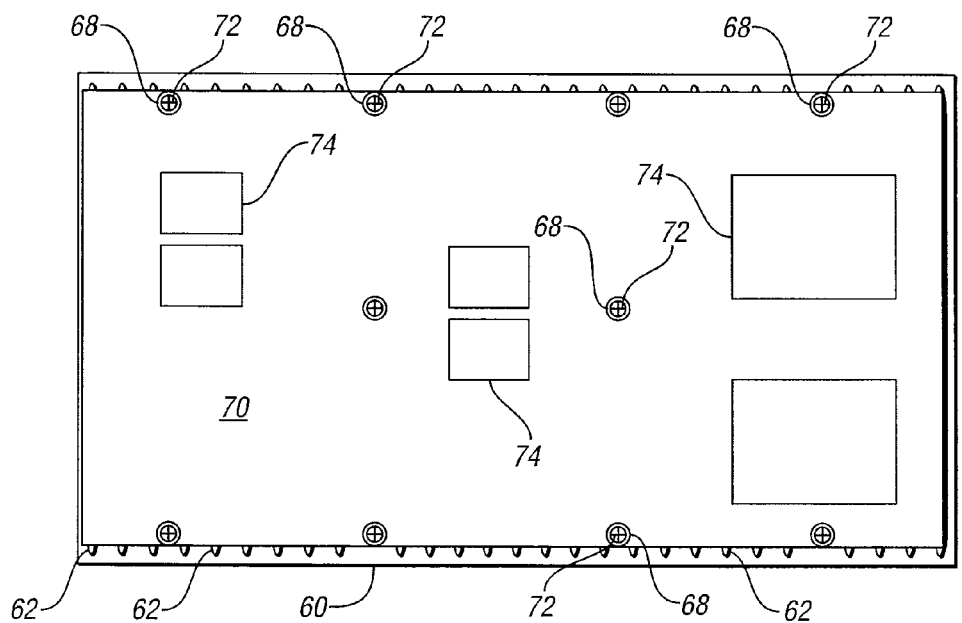
FIG. 4 illustrates a printed circuit board (PCB) secured to the base plate, with the gap filler material displaced to form a thermally conductive and electrically isolating interface.

FIG. 4 illustrates a printed circuit board (PCB) 70 secured to the base plate 60, with the gap filler material displaced, and cured into a solid, to form a thermally conductive and electrically isolating interface (FIG. 2). Preferably, the interface includes a substantially uniform layer of the gap filler material between the printed circuit board 70 and the base plate 60, covering the traces and components. Fasteners 72 extend through holes 68, into base plate 60. Top components 74 are shown; the bottom components are received in respective depressions.

It is appreciated that embodiments of the invention have a variety of applications. For example, PCB 70 may be a power electronics printed circuit board with a length of at least 6 inches and a width of at least 6 inches, with FIGS. 2-4 illustrating an onboard battery charger for an automotive vehicle, and with the PCB components composing a battery charger circuit.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus comprising:
    a base plate including a plurality of depressions and a plurality of first holes in the base plate;
    a power electronics printed circuit board including a plurality of traces, a plurality of high voltage components, and a plurality of second holes in the power electronics printed circuit board, the plurality of high voltage components being located at a plurality of locations corresponding to the plurality of depressions in the base plate;
    a plurality of fasteners extending through the plurality of first and second holes and securing the printed circuit board to the base plate with the plurality of high voltage components received at the corresponding plurality of depressions;
    and a thermally conductive and electrically isolating interface between the base plate and the printed circuit board, the interface being made of a gap filler material conforming to the base plate and to the plurality of depressions in the base plate, and conforming to the printed circuit board and to the plurality of high voltage components;
    wherein conforming of the gap filler material maintains contact between the base plate and substantially all of a surface of the printed circuit board including the plurality of traces and the plurality of high voltage components so that the printed circuit board is secured to the base plate by the plurality of fasteners substantially without deflection of the printed circuit board, and wherein a gap between either the power electronics printed circuit board and the base plate or the high voltage components and the base plate is less than 2 mm.

2. The apparatus of claim 1 wherein interface is formed by applying the gap filler material as a substantially liquid material that cures into a solid, such that the substantially liquid material is displaced when the printed circuit board is secured to the base plate to cause the gap filler material to conform to the base plate, the plurality of depressions, the printed circuit board, and the plurality of high voltage components.

3. The apparatus of claim 2 wherein the gap filler material is applied in two parts which are mixed and that cure into the solid.

4. The apparatus of claim 2 wherein the interface includes a substantially uniform layer of the gap filler material between the printed circuit board and the base plate.

5. The apparatus of claim 4 wherein the layer covers the plurality of high voltage components.

6. The apparatus of claim 1 wherein the interface includes a substantially uniform layer of the gap filler material between the printed circuit board and the base plate.

7. The apparatus of claim 6 wherein the layer covers the plurality of high voltage components.

8. An onboard battery charger for an automotive vehicle, the battery charger comprising:
    a housing including a base plate, the base plate including a plurality of depressions and a plurality of first holes in the base plate;
    a power electronics printed circuit board including a plurality of traces, a plurality of high voltage components, and a plurality of second holes in the power electronics printed circuit board, the plurality of high voltage components being located at a plurality of locations corresponding to the plurality of depressions in the base plate, the printed circuit board including a battery charger circuit;
    a plurality of fasteners extending through the plurality of first and second holes and securing the printed circuit board to the base plate with the plurality of high voltage components received at the corresponding plurality of depressions; and
    a thermally conductive and electrically isolating interface between the base plate and the printed circuit board, the interface being made of a gap filler material conforming to the base plate and to the plurality of depressions in the base plate, and conforming to the printed circuit board and to the plurality of high voltage components;
    wherein conforming of the gap filler material maintains contact between the base plate and substantially all of a surface of the printed circuit board including the plurality of traces and the plurality of high voltage components so that the printed circuit board is secured to the base plate by the plurality of fasteners substantially without deflection of the printed circuit board, and wherein a gap between either the power electronics printed circuit board and the base plate or the high voltage components and the base plate is less than 2 mm.

9. The battery charger of claim 8 wherein interface is formed by applying the gap filler material as a substantially liquid material that cures into a solid, such that the substantially liquid material is displaced when the printed circuit board is secured to the base plate to cause the gap filler material to conform to the base plate, the plurality of depressions, the printed circuit board, and the plurality of high voltage components.

10. The battery charger of claim 9 wherein the gap filler material is applied in two parts which are mixed and that cure into the solid.

11. The battery charger of claim 9 wherein the interface includes a substantially uniform layer of the gap filler material between the printed circuit board and the base plate.

12. The battery charger of claim 11 wherein the layer covers the plurality of high voltage components.

13. The battery charger of claim 8 wherein the interface includes a substantially uniform layer of the gap filler material between the printed circuit board and the base plate.

14. The battery charger of claim 13 wherein the layer covers the plurality of high voltage components.

15. The battery charger of claim 8 wherein the printed circuit board has a length of at least 6 inches and a width of at least 6 inches.

16. A method of making a power electronics apparatus, the method comprising:
    providing a base plate including a plurality of depressions and a plurality of first holes in the base plate;
    providing a power electronics printed circuit board including a plurality of traces a plurality of high voltage components, and a plurality of second holes in the power electronics printed circuit board, the plurality of high voltage components being located at a plurality of locations corresponding to the plurality of depressions in the base plate;
    forming a thermally conductive and electrically isolating interface between the base plate and the printed circuit board, the interface being made of a gap filler material conforming to the base plate and to the plurality of depressions in the base plate, and conforming to the printed circuit board and to the plurality of high voltage components; and
    securing the printed circuit board to the base plate with the plurality of high voltage components received at the corresponding plurality of depressions;

wherein conforming of the gap filler material maintains contact between the base plate and substantially all of a surface of the printed circuit board including the plurality of traces and the plurality of high voltage components so that the printed circuit board is secured to the base plate by a plurality of fasteners substantially without deflection of the printed circuit board, and wherein a gap between either the power electronics printed circuit board and the base plate or the high voltage components and the base plate is less than 2 mm.

17. The method of claim 16 wherein forming further comprises:

applying the gap filler material as a substantially liquid material that cures into a solid, such that the substantially liquid material is displaced when the printed circuit board is secured to the base plate to cause the gap filler material to conform to the base plate, the plurality of depressions, the printed circuit board, and the plurality of high voltage components.

18. The method of claim 17 wherein the gap filler material is applied in two parts which are mixed and that cure into the solid.

19. The method of claim 17 wherein the interface includes a substantially uniform layer of the gap filler material between the printed circuit board and the base plate.

20. The method of claim 19 wherein the layer covers the plurality of high voltage components.

* * * * *